United States Patent
Jung et al.

(10) Patent No.: US 9,942,501 B2
(45) Date of Patent: Apr. 10, 2018

(54) IMAGE SENSOR AND METHOD FOR DRIVING IMAGE SENSOR

(71) Applicant: SAMSUNG ELECTRONICS CO., LTD., Suwon-si (KR)

(72) Inventors: Myounghoon Jung, Bucheon-si (KR); Jungwoo Kim, Hwaseong-si (KR); Youngjun Yun, Yongin-si (KR); Seungeon Ahn, Hwaseong-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 18 days.

(21) Appl. No.: 15/031,538

(22) PCT Filed: Oct. 22, 2014

(86) PCT No.: PCT/KR2014/009956
§ 371 (c)(1),
(2) Date: Apr. 22, 2016

(87) PCT Pub. No.: WO2015/060643
PCT Pub. Date: Apr. 30, 2015

(65) Prior Publication Data
US 2016/0277696 A1    Sep. 22, 2016

(30) Foreign Application Priority Data
Oct. 23, 2013    (KR) .................. 10-2013-0126702

(51) Int. Cl.
*H04N 5/335*    (2011.01)
*H04N 5/3745*   (2011.01)
*H04N 5/378*    (2011.01)
*H01L 27/146*   (2006.01)

(52) U.S. Cl.
CPC ..... *H04N 5/3745* (2013.01); *H01L 27/14612* (2013.01); *H01L 27/14643* (2013.01); *H04N 5/378* (2013.01)

(58) Field of Classification Search
CPC .................................................. H04N 5/3745
See application file for complete search history.

(56) References Cited

U.S. PATENT DOCUMENTS

| | | |
|---|---|---|
| 6,252,462 B1 | 6/2001 | Hoffman |
| 7,436,038 B2 | 10/2008 | Engelmann et al. |
| 7,453,131 B2 | 11/2008 | Marshall et al. |

(Continued)

FOREIGN PATENT DOCUMENTS

| | | |
|---|---|---|
| JP | 2009-238985 A | 10/2009 |
| KR | 10-2008-0012665 A | 2/2008 |

(Continued)

OTHER PUBLICATIONS

International Search Report dated Jan. 13, 2015 issued by the International Searching Authority in counterpart International Application No. PCT/KR2014/009956 (PCT/ISA/210).

(Continued)

*Primary Examiner* — Gary C Vieaux
(74) *Attorney, Agent, or Firm* — Sughrue Mion, PLLC (57) ABSTRACT

Provided are an image sensor compensating for property degradation of a metal-oxide-semiconductor (MOS) resulting from a threshold voltage shift that may occur when photodiodes and a MOS circuit of configuring an amplifier are integrated on the same substrate, and a method for driving the image sensor.

20 Claims, 6 Drawing Sheets

(56) References Cited

U.S. PATENT DOCUMENTS

| 7,551,059 B2 | 6/2009 | Farrier |
| 2004/0135913 A1 | 7/2004 | Shinotsuka et al. |

FOREIGN PATENT DOCUMENTS

| KR | 10-2008-0061061 A | 7/2008 |
| KR | 10-2012-0015650 A | 2/2012 |
| KR | 10-2012-0116795 A | 10/2012 |

OTHER PUBLICATIONS

Written Opinion dated Jan. 13, 2015 issued by the International Searching Authority in counterpart International Application No. PCT/KR2014/009956 (PCT/ISA/237).

IMAGE SENSOR AND METHOD FOR DRIVING IMAGE SENSOR

This is a National Stage Entry of International Application No. PCT/KR2014/009956 filed Oct. 22, 2014, which claims priority to Korean Patent Application No. 10-2013-0126702 filed Oct. 23, 2013, the contents of all of which are incorporated herein by reference in their entirety.

TECHNICAL FIELD

The present disclosure relates to an image sensor, and a method for driving the same.

BACKGROUND ART

A short wave infrared ray (SWIR) image sensor may be used when it is impossible to use existing image sensors in conditions, for example, in bad weather, on cloudy days, or during night, and thus, the SWIR image sensor has been widely used in various fields such as geology, bio-chemistry, and meteorology. With regard to the SWIR image sensor, a photodiode having a semiconductor layer formed of indium gallium arsenide (InGaAs) is mainly used due to characteristics of wavelength. Fine current output from the photodiode is transmitted to an external read-out circuit through an amplifier configured as a metal-oxide-semiconductor (MOS) circuit on pixels of an image sensor.

After the photodiode having the semiconductor layer formed of InGaAs is formed on an indium phospide (InP) substrate, and the amplifier are formed on a substrate as the MOS circuit, each pixel of the SWIR image sensor may be manufactured by electrically coupling the two substrates. In this case, however, problems about costs of the InP substrate, coupling reliability, a limit to resolution, etc. may exist. Therefore, researches into a monolithic integration for simultaneously forming photodiodes and an amplifier have been conducted. However, with regard to a monolithic integration method, a temperature condition of a process for forming photodiodes and that of a process for forming an amplifier on a silicon (Si) substrate are different, and thus, the processes for forming the photodiodes and the amplifier are separately performed according to time. Properties of the MOS circuit of embodying the amplifier formed prior to the process for forming the photodiodes may be degraded due to a shift of threshold voltage of a transistor that may occur when the photodiodes are formed.

DISCLOSURE

Technical Solution

Provided are an image sensor of compensating for property degradation of a metal-oxide-semiconductor (MOS) resulting from a threshold voltage shift that may occur when photodiodes and a MOS circuit configuring an amplifier are integrated on the same substrate, and a method for driving the image sensor. However, the technical goal of the present disclosure is not limited thereto, and other technical goals may be inferred from the following embodiments. Additional aspects will be set forth in part in the description which follows and, in part, will be apparent from the description, or may be learned by practice of the presented embodiments.

According to one or more embodiments of the disclosure, an image sensor including a pixel array includes: a photoelectric transformation unit for generating charges according to photoelectric transformation in each of pixels; an amplifier unit for amplifying current according to the generated charges in each pixel; and a compensation unit for applying compensation voltage compensating for threshold voltage shift to at least one of a plurality of transistors forming the amplifier unit.

According to one or more embodiments of the disclosure, a method of driving an image sensor, wherein the image sensor includes a pixel array where a photoelectric transformation unit for generating charges according to photoelectric transformation, and an amplifier unit for amplifying current according to the generated charges are prepared in each pixel, the method includes: applying compensation voltage for compensating for threshold voltage shift to at least one of a plurality of transistors forming the amplifier unit included in each pixel; generating the charges according to the photoelectric transformation in the respective pixels; and amplifying the current according to the generated charges in the respective pixels.

BEST MODE

According to one or more embodiments of the disclosure, an image sensor including a pixel array includes: a photoelectric transformation unit for generating charges according to photoelectric transformation in each of pixels; an amplifier unit for amplifying current according to the generated charges in each pixel; and a compensation unit for applying compensation voltage compensating for threshold voltage shift to at least one of a plurality of transistors forming the amplifier unit.

MODE FOR INVENTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

One or more embodiments of the present disclosure relate to an image sensor 1000 and a method for driving the image sensor, and the detailed descriptions that are well known to one of ordinary skill in the art will be omitted.

Figure 1:
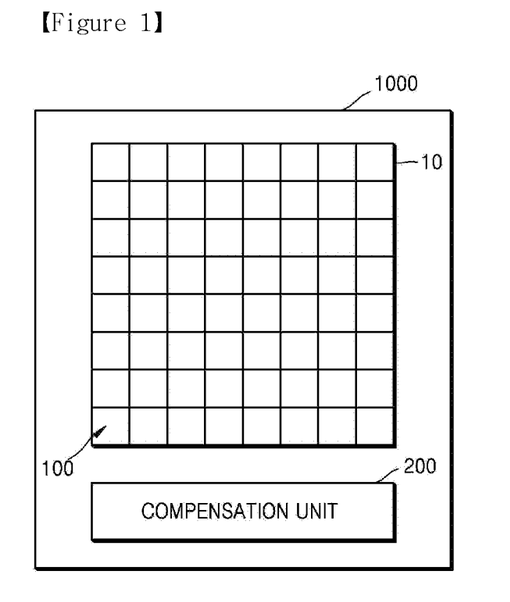
FIG. 1 illustrates an image sensor according to an embodiment of the present disclosure.

FIG. 1 illustrates the image sensor 1000 according to an embodiment of the present disclosure. One of ordinary skill in the art may understand that other components other than the components illustrated in FIG. 1 may be further included. Referring to FIG. 1, the image sensor 1000 may include a pixel array 10 formed of a plurality of pixels 100, and a compensation unit 200. The image sensor 1000 may be manufactured as a chip by further including a clock generation unit (not shown), a raw driver (not shown), an analogue-digital conversion unit (not shown), etc.

The pixel array 10 may be formed of the pixels 100. The respective pixels 100 forming the pixel array 10 may receive light to generate electrical signals, and may be configured as a circuit for outputting the electrical signals to the outside through lines connected to the respective pixels 100.

Each pixel 100 forming the pixel array 10 may include a photoelectric transformation unit (not shown) that receives light from the outside in order to generate charges according to photoelectric transformation, and an amplifier unit (not shown) that amplifies current according to the charges generated in the photoelectric transformation unit (not shown), and may be configured on a single substrate. In this case, the substrate may be a substrate formed of silicon. Hereinafter, referring to FIG. 2, a pixel circuit configured in the respective pixels 100 of the pixel array 10 included in the image sensor 1000 will be described in detail.

Figure 2:
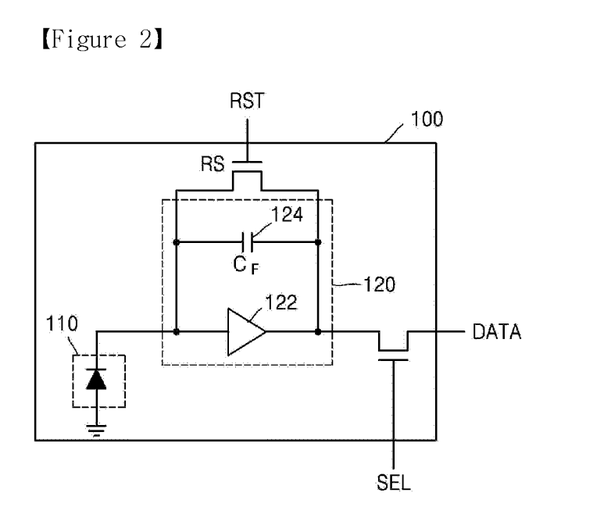
FIG. 2 is a diagram illustrating a pixel circuit configured in each of pixels of a pixel array included in the image sensor according to an embodiment of the present disclosure.

FIG. 2 is a diagram illustrating the pixel circuit configured in the respective pixels 100 of the pixel array 10 included in the image sensor 1000 according to an embodiment of the present disclosure. One of ordinary skill in the art may understand that other components other than the components illustrated in FIG. 2 may be further included.

Referring to FIG. 2, each pixel 100 of the pixel array 10 may include a photoelectric transformation unit 110, an amplifier unit 120, and switching transistors RS and SS operating according to external signals RST and SEL. The amplifier unit 120 may include an amplifier 122 and a feedback capacitor $C_F$ 124.

The photoelectric transformation unit 110 receives the light projected to the pixels 100, and generates the charges according to the photoelectric transformation. The photoelectric transformation unit 110 may be formed of at least one photoelectric transformation device. The at least one photoelectric transformation device may be a photodiode.

The amplifier unit 120 receives current according to the charges generated in the photoelectric transformation unit 110, and output the current by amplifying the same. The amplifier unit 120 may include the amplifier 122 having an input terminal in which current is input according to the charges generated in the photoelectric transformation unit 110, and an output terminal that amplifies the input current and outputs the same, and the feedback capacitor $C_F$ 124 that is connected to the input and output terminals of the amplifier 122, and charges or discharges the current according to the charges generated in the photoelectric transformation unit 110. That is, the amplifier unit 120 may be configured as capacitive transimpedance amplifier (CTIA).

The amplifier 122 of the amplifier unit 120 may be formed of a plurality of transistors. In this regard, the transistors may be n-MOS transistors or p-MOS transistors, and accordingly, the amplifier 122 may be configured as a complementary MOS (CMOS) circuit.

A reset transistor RS operates according to reset signals RST that are input from the outside of the pixels 100. The reset transistor RS may be turned on when the reset signals RST are input from the outside of the pixels 100, may discharge the feedback capacitor $C_F$ 124, and may reset bias voltage of the photodiode forming the photoelectric transformation unit 110 to an initial stage. The reset transistor RS may be turned off when the reset signals RST are not input from the outside of the pixels 100, and may charge the feedback capacitor $C_F$ 124.

A select transistor SS operates according to select signals SEL that are input from the outside of the pixels 100. The select transistor SS may be turned on when the select signals SEL are input from the outside of the pixels 100, and may transmit output of the amplifier unit 120 to the outside of the pixels 100. The select transistor SS may be turned off when the select signals SEL are not input from the outside of the pixels 100, and may not transmit the output of the amplifier unit 120 to the outside of the pixels 100.

In a case where monolithic integration that forms both the photoelectric transformation unit 110 and the amplifier unit 120 on one substrate is performed, the amplifier unit 120 configured as the CMOS circuit are formed on the substrate first, and then the photoelectric transformation unit 120 configured as the photodiode is formed because temperature conditions of respective processes for forming the photodiode and the CMOS circuit are different. However, when an epitaxial process for forming the photodiode is performed after the CMOS circuit is formed on the substrate, a dopant in channels of the n-MOS transistor or the p-MOS transistor formed on the substrate may be diffused due to heat treatment in the epitaxial process, and thus, a threshold voltage shift that a threshold voltage value exceeds a range of the threshold voltage value at the time of designing the MOS transistors may occur. Such threshold voltage shift causes performance degradation of the MOS transistor, and even performance degradation of the amplifier unit 120, thereby degrading performance of the image sensor 1000. Thus, it is necessary to compensate for the bias voltage of the MOS transistor in which the threshold voltage shift occurs so as to prevent the performance degradation of the MOS transistor according to the threshold voltage shift.

Referring again to FIG. 1, the image sensor 1000 may include a compensation unit 200. The compensation unit 200 functions to compensate for the bias voltage of the transistor in which the threshold voltage shift occurs in order to prevent the performance degradation of the transistor according to the above-described threshold voltage shift.

The compensation unit 200 may apply at least one compensation voltage to the transistors forming the amplifier unit 120 configured in each of the pixels 100 of the pixel array 10. The compensation unit 200 may be connected to each of the transistors forming the amplifier unit 120 of the respective pixels 100. Hereinafter, image sensor 1000 according to one or more embodiments of the present disclosure will be described with reference to FIGS. 3 to 6.

Figure 3:
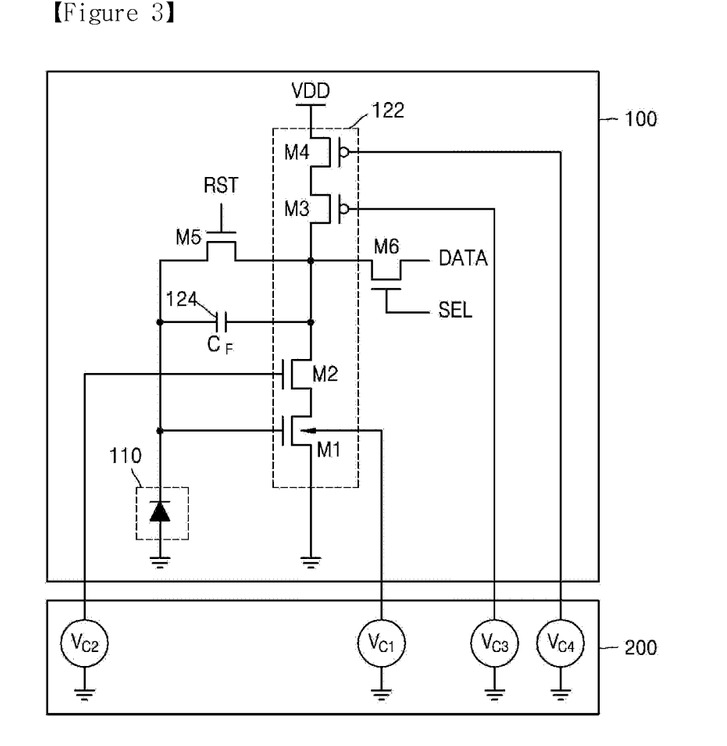
FIG. 3 is a diagram of an image sensor according to a first embodiment of the present disclosure.

FIG. 3 is a diagram of an image sensor according to a first embodiment of the present disclosure. One of ordinary skill in the art may understand that other components other than the components illustrated in FIG. 3 may be further included.

FIG. 3 illustrates a connection any one of the pixels 100 forming the pixel array 10 with the compensation unit 200.

Each pixel 100 may include the photoelectric transformation unit 110, the amplifier 122, the feedback capacitor $C_F$ 124, and the switching transistors M5 and M6 operating according to the external signals RST and SEL.

The photoelectric transformation unit 110 receives the light projected to the pixels 100, and generates the charges according to the photoelectric transformation. As illustrated in FIG. 3, the photoelectric transformation unit 110 may be the photodiode. The photoelectric transformation unit 110 may be connected to the input terminal of the amplifier 122.

The amplifier 122 has the input terminal in which the current according to the charges generated in the photoelectric transformation unit 110 is input, and the output terminal that amplifies and outputs the input current. The amplifier 122 may have transistors, and the transistors may be the n-MOS transistor or the p-MOS transistor. That is, the amplifier 122 may be configured as the CMOS circuit. In particular, the amplifier may be a cascode CMOS inverter.

The feedback capacitor $C_F$ 124 may be connected to the input and output terminals of the amplifier 122, and may charge or discharge the current according to the charges generated in the photoelectric transformation unit 110. The amplifier 122 and the feedback capacitor $C_F$ 124 form the amplifier unit 120, and the amplifier unit 120 may be configured as the CTIA.

The M5 transistor is a reset transistor, and is capable of charging or discharging the feedback capacitor $C_F$ 124 according to the reset signals RST input from the outside of the pixels 100, and resetting the bias voltage of the photodiode forming the photoelectric transformation unit 110 to the initial stage. The reset transistor M5 may be connected to the input and output terminals of the amplifier 122, and may be connected to the feedback capacitor $C_F$ 124 in parallel.

The M6 transistor is the select transistor, and is capable of transmitting the output of the amplifier unit 120 or blocking it according to the select signals SEL input from the outside of the pixels 100.

The M5 and M6 transistors that do not form the amplifier 122 operate in a linear region although the threshold voltage of the transistors changes due to the heat treatment process, and thus, the M5 and M6 transistors do not seriously affect operations of the pixel circuit. However, M1 to M4 transistors operate in a saturation region, and thus, the M1 to M4 transistors may affect the operations of the pixel circuit. Hereinafter, roles and connection relations of the M1 to M4 transistors will be described.

The M1 transistor is an amplifying transistor, and a gate electrode is connected to the input terminal of the amplifier 122. That is, the current according to the charges generated in the photoelectric transformation unit 110 is input in the gate electrode of the amplifying transistor. A source electrode of the M1 transistor is grounded, and a drain electrode is connected to a source electrode of the M2 transistor.

The M2 and M3 transistors are common-gate transistors, and each of drain electrodes are connected to the output terminal of the amplifier 122.

The M4 transistor is a current-source transistor, and a drain electrode of the M4 transistor is connected to a source electrode of the M3 transistor, and a source electrode of the M4 transistor is connected to VDD.

The transistors forming the amplifier 122 may be four or more transistors unlike the description of FIG. 2. For example, common-gate transistors may be added in order to increase gain values.

As described above, the M1 to M4 transistors forming the amplifier 122 may have the threshold voltage shift, that a threshold voltage value at the time of forming the amplifier 122 on a substrate is different from a threshold voltage value at the time of designing the MOS transistors, results from the heat treatment process while forming the photoelectric transformation unit 110 on the same substrate. Such threshold voltage shift causes performance degradation of the MOS transistor, thereby degrading performance of the image sensor 1000. Therefore, the compensation unit 200 may compensate for the threshold voltage shift of the M1 to M4 transistors forming the amplifier 122 as follows.

With regard to the M1 transistor that is the amplifying transistor, the gate electrode is connected to the input terminal of the amplifier 122, the current according to the charges generated in the photoelectric transformation unit 110 is input, and thus, the bias voltage of the gate electrode may not be easily controlled. Accordingly, for the M1 transistor that is the amplifying transistor, a method for compensating for the threshold voltage shift may be used by applying a first compensation voltage to a body electrode instead of connecting the body electrode to a ground. The first compensation voltage applied to the body electrode and the threshold voltage of the M1 transistor, which is the amplifying transistor, may be defined in Equation 1.

$$V_T = T_{T\_M1} + \gamma\sqrt{\varphi - V_{C1}} - \sqrt{\varphi}$$ [Equation 1]

$V_T$ is the threshold voltage compensated by the first compensation voltage, $V_{C1}$, of the M1 transistor that is the amplifying transistor. $V_{T\_M1}$ is the threshold voltage before the compensation of the M1 transistor. $\gamma$ is a constant that is used while designing the M1 transistor. $\varnothing$ is also a constant that is a value of a certain voltage used while designing the M1 transistor.

As the first compensation voltage, $V_{C1}$, of the M1 transistor that is the amplifying transistor is increased, the compensated threshold voltage, $V_T$, is decreased. On the contrary, as the first compensation voltage, $V_{C1}$, of the M1 transistor that is the amplifying transistor is decreased, the compensated threshold voltage, $V_T$, is increased. Therefore, by adjusting the first compensation voltage, $V_{C1}$, the threshold voltage shift of the M1 transistor that is the amplifying transistor may be compensated.

With regard to the M2 and M3 transistors that are the common-gate transistors, a method for respectively applying a second compensation voltage and a third compensation voltage to the gate electrode may be used.

The compensation unit 200 may determine the second compensation voltage applied to the gate electrode of the M2 transistor that is the common-gate transistor according to the following equation. However, the equation of determining the second compensation voltage is not limited thereto.

$$V_{C2} = V_{DS\_M1} + V_{DS\_M2} + V_{T\_M2} \quad \text{[Equation 2]}$$

$V_{C2}$ is the second compensation voltage of the M2 transistor that is the common-gate transistor. $V_{DS\_M1}$ is drain-source voltage of the M1 transistor connected to the M2 transistor. $V_{DS\_M2}$ is drain-source voltage of the M2 transistor. $V_{T\_M2}$ is the threshold voltage before the compensation of the M2 transistor.

The compensation unit 200 may determine the third compensation voltage applied to the gate electrode of the M3 transistor that is the common-gate transistor according to the following equation.

$$V_{C3} = VDD - V_{DS\_M3} - V_{DS\_M4} - |V_{T\_M3}| \quad \text{[Equation 3]}$$

$V_{C3}$ denotes the third compensation voltage of the M3 transistor that is the common-gate transistor. VDD is power voltage that is input to the source electrode of the M4 transistor. $V_{DS\_M3}$ is drain-source voltage of the M3 transistor. $V_{DS\_M4}$ is drain-source voltage of the M4 transistor connected to the M3 transistor. $V_{T\_M3}$ is the threshold voltage before the compensation of the M3 transistor.

For the M4 transistor that is a current source transistor, a method for applying the fourth compensation voltage to the gate electrode may be used.

The compensation unit 200 may determine the fourth compensation voltage applied to the gate electrode of the M4 transistor that is the current source transistor according to the following equation. However, the equation of determining the fourth compensation voltage is not limited thereto.

$$V_{C4} = VDD - V_{DS\_M4} - |V_{T\_M4}| \quad \text{[Equation 4]}$$

$V_{C4}$ denotes the fourth compensation voltage of the M4 transistor that is the current source transistor. VDD is power voltage that is input to the source electrode of the M4 transistor. $V_{DS\_M4}$ is drain-source voltage of the M4 transistor. $V_{T\_M4}$ is the threshold voltage before the compensation of the M3 transistor.

As described above, the compensation unit 200 determines each compensation voltage of the transistors forming the amplifier 122, and may apply different compensation voltage to each of the transistors forming the amplifier 122. Therefore, the compensation unit 200 may include a plurality of variable voltage sources in order to variably apply the compensation voltage to each of the transistors forming the amplifier 122. Each of the variable voltage sources may be connected to each of the transistors forming the amplifier 122. The compensation unit 200 may be configured as a form of FIG. 4 in order to generate and apply the compensation voltage rather actively. Hereinafter, the detailed description will be provided with reference to FIG. 4.

Figure 4:
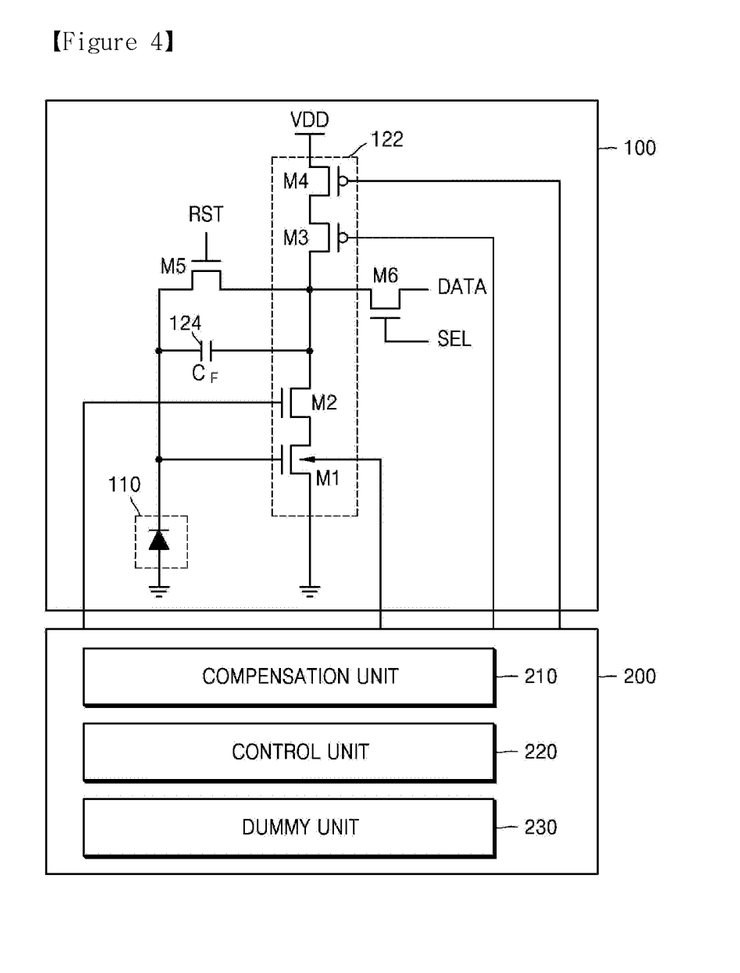
FIG. 4 is a diagram of an image sensor according to a second embodiment of the present disclosure.

FIG. 4 is a diagram of an image sensor according to a second embodiment of the present disclosure. One of ordinary skill in the art may understand that other components other than the components illustrated in FIG. 4 may be further included. The description that is already provided in FIG. 3 will be omitted.

Referring to FIG. 4, the compensation unit 200 may include a power unit 210, a control unit 220, and a dummy unit 230.

The power unit 210 may generate the compensation voltage determined in the control unit 220, and may apply the generated compensation voltage to the transistors forming the amplifier unit 120.

The control unit 220 uses the dummy unit 230 including dummy transistors in order to determine each compensation voltage for the respective transistors forming the amplifier unit 120. That is, the control unit 220 may determine each compensation voltage that corresponds to each of the transistors, and forms the amplifier unit 120 by using the dummy transistors.

The dummy unit 230 may include the dummy transistors that correspond to each of the transistors forming the amplifier unit 120. The dummy transistors are transistors used for measuring the threshold voltage shift of the transistors forming the amplifier unit 120. The compensation unit 200 may have separate dummy transistors corresponding to each of the transistors forming the amplifier unit 120, and may use the separate dummy transistors for measuring the actual threshold voltage shift of the transistors.

Figure 5:
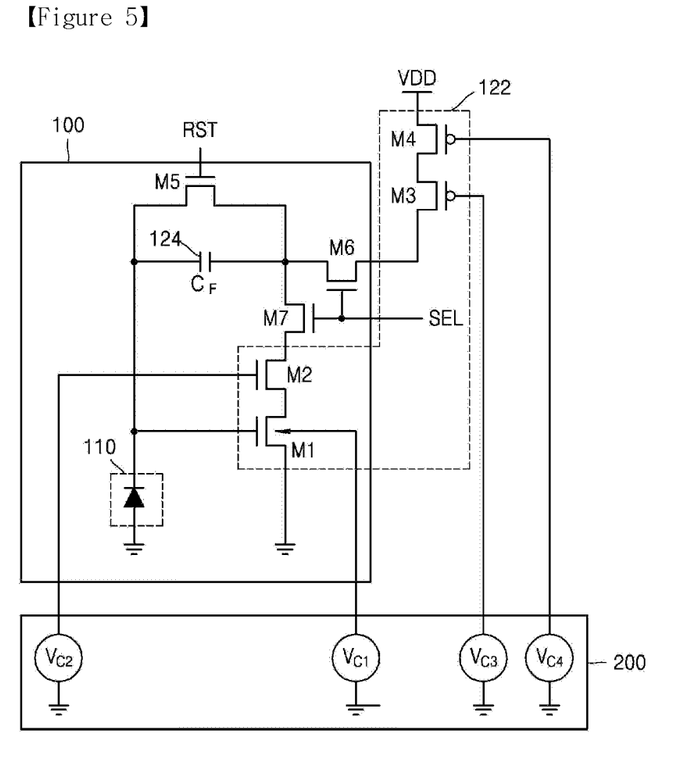
FIG. 5 is a diagram of an image sensor according to a third embodiment of the present disclosure.

FIG. 5 is a diagram of an image sensor according to a third embodiment of the present disclosure. One of ordinary skill in the art may understand that other components other than the components illustrated in FIG. 5 may be further included.

Referring to FIG. 5, a connection of any one of pixels 100 forming the pixel array 10 with the compensation unit 200 is illustrated.

The pixels 100 may include the photoelectric transformation unit 110, the amplifier 122, the feedback capacitor $C_F$ 124, and the switching transistors M5, M6 and M7 operating according to the external signals RST and SEL. Some transistors M3 and M4 from among the transistors M1, M2, M3 and M4 forming the amplifier 122 may be disposed outside the substrate of the pixels 100.

The photoelectric transformation unit 110 receives the light projected to the pixels 100, and generates the charges according to the photoelectric transformation. The photoelectric transformation unit 110 may be the photodiode as illustrated in FIG. 5. The photoelectric transformation unit 110 may be connected to the input terminal of the amplifier 122.

The amplifier 122 includes the input terminal in which the current according to the charges generated in the photoelectric transformation unit 110 is input, and the output terminal that amplifies and outputs the input current. The amplifier 122 may be formed of the transistors, and the transistors may be the n-MOS transistor or the p-MOS transistor. Referring to FIG. 5, M1 and M2 are the n-MOS transistors, and M3 and M4 are the p-MOS transistors. That is, the amplifier 122 of FIG. 5 may be configured as the CMOS circuit. In particular, the amplifier 122 may be the cascode CMOS inverter.

The feedback capacitor $C_F$ 124 may be connected to the input and output terminals of the amplifier 122, and may charge or discharge the current according to the charges generated in the photoelectric transformation unit 110. The amplifier 122 and the feedback capacitor $C_F$ 124 form the amplifier unit 120, and may configure the CTIA.

The M5 transistor is the reset transistor, and is capable of charging or discharging the feedback capacitor $C_F$ 124 according to the reset signals RST input from the outside of the pixels 100, and resetting the bias voltage of the photodiode forming the photoelectric transformation unit 110 to the initial stage. The reset transistor M5 may be connected to the input and output terminals of the amplifier 122, and may be connected to the feedback capacitor $C_F$ 124 in parallel.

The M6 and M7 transistors are the select transistors, and are capable of transmitting the output of the amplifier unit 120 or blocking it according to the select signals SEL input from the outside of the pixels 100.

The M5, M6 and M7 transistors that do not form the amplifier 122 operate in the linear region although the threshold voltage of the transistors changes due to the heat treatment process, and thus, the M5, M6 and M7 transistors do not seriously affect the operations of the pixel circuit. However, M1 to M4 transistors forming the amplifier 122 operate in a saturation region, and thus, the M1 to M4 transistors may affect the operations of the pixel circuit.

Unlike the FIG. 3, the M3 and M4 transistors, which is the p-MOS transistors, may not disposed on the substrate, and may be disposed outside the substrate of the pixels 100. Instead, the M7 transistor is disposed between the drain electrode of the M2 transistor and the output terminal of the amplifier 122. Since the M3 and M4 transistors are disposed outside the substrate of the pixels 100, an area of the pixels 100 for receiving the light may be increased.

The M1 transistor is the amplifying transistor, the M2 and M3 transistors are the common-gate transistors, and the M4 transistor is the current-source transistor. The M3 transistor from among the common-gate transistors, and the M4 transistor from among the current-source transistor may be disposed outside the substrate of the pixels 100.

As described in FIG. 3, the compensation unit 200 may apply the compensation voltage of compensating for the threshold voltage shift to at least one of the transistors forming the amplifier unit 120 in order to compensate for the threshold voltage shift of the transistors forming the amplifier unit 120 that results from the heat treatment process while forming the photoelectric transformation unit 110.

With regard to the M1 transistor that is the amplifying transistor, the compensation unit 200 may compensate for the threshold voltage shift by applying the first compensation voltage to the body electrode instead of connecting the body electrode to the ground. With regard to the M2 and M3 transistors that are the common-gate transistors, the compensation unit 200 may respectively apply the second and third compensation voltage to the gate electrodes, and may compensate for the threshold voltage shift. With regard to the M4 transistor that is the current source transistor, the compensation unit 200 may compensate for the threshold voltage shift by applying the fourth compensation voltage to the gate electrode.

The compensation unit 200 may apply the different compensation voltage to each of the transistors forming the amplifier 122. Therefore, the compensation unit 200 may include the variable voltage sources in order to variably apply the compensation voltage to each of the transistors forming the amplifier 122. Each of the variable voltage sources may be connected to respective transistors forming the amplifier 122. The compensation unit 200 may be configured as a form of FIG. 6 in order to generate and apply the compensation voltage rather actively. Hereinafter, the detailed description will be provided with reference to FIG. 6.

Figure 6:
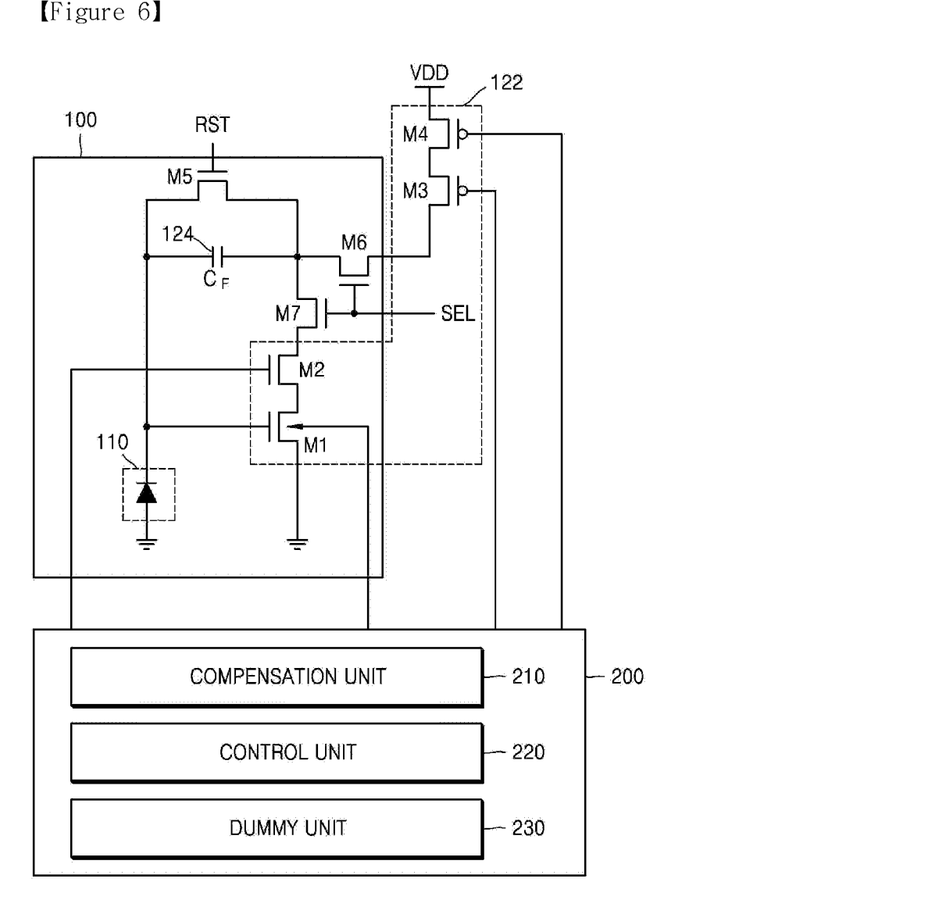
FIG. 6 is a diagram of an image sensor according to a fourth embodiment of the present disclosure.

FIG. 6 is a diagram of an image sensor according to a fourth embodiment of the present disclosure. One of ordinary skill in the art may understand that other components other than the components illustrated in FIG. 6 may be further included. Hereinafter, the description that is already provided in FIG. 5 will be omitted.

Referring to FIG. 6, the compensation unit 200 may include the power unit 210, the control unit 220, and the dummy unit 230.

The power unit 210 may generate the compensation voltage determined in the control unit 220, and may apply the generated compensation voltage to the transistors forming the amplifier unit 120.

The control unit 220 uses the dummy unit 230 including the dummy transistors in order to determine each compensation voltage for the respective transistors forming the amplifier unit 120. That is, the control unit 220 may determine each compensation voltage that corresponds to each of the transistors, and forms the amplifier unit 120 by using the dummy transistors.

The dummy unit 230 may include the dummy transistors that correspond to each of the transistors forming the amplifier unit 120. The dummy transistors are transistors used for measuring the threshold voltage shift of the transistors forming the amplifier unit 120. The compensation unit 200 may have the separate dummy transistors corresponding to each of the transistors forming the amplifier unit 120, and may use the separate dummy transistors for measuring the actual threshold voltage shift of the transistors.

Figure 7:
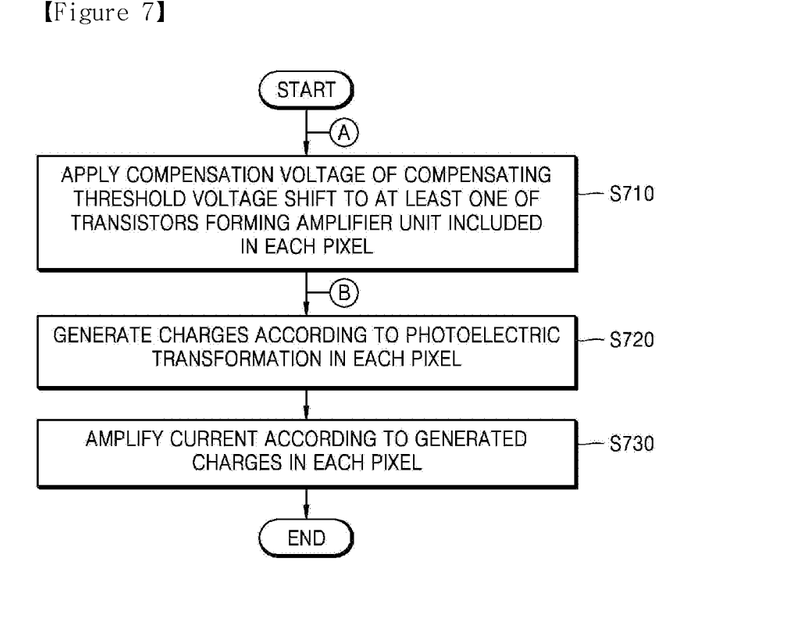
FIG. 7 is a flowchart illustrating a method for driving an image sensor according to an embodiment of the present disclosure.

FIG. 7 is a flowchart illustrating a method for driving an image sensor according to an embodiment of the present disclosure. Although some descriptions are omitted, the descriptions described above with regard to the image sensor 1000 may be applied to the method for driving the image sensor 1000 according to the embodiments of the present disclosure.

According to an embodiment of the present disclosure, the method for driving the image sensor 1000 including the pixel array 10 where the photoelectric transformation unit 110, which generates the charges according to the photoelectric transformation, and the amplifier unit 120, which amplifies the current according to the charges generated in the photoelectric transformation unit 110, is included in the respective pixels 100 may include the following processes.

In operation S710, the compensation unit 200 may apply the compensation voltage of compensating for the threshold voltage shift to the at least one of the transistors forming the amplifier unit 120 in order to compensate for the threshold voltage shift of the transistors forming the amplifier unit 120 that results from the heat treatment process while forming the photoelectric transformation unit 110.

In this regard, the amplifier unit 120 may be formed of the transistors such as the amplifying transistor, the common-gate transistor, and the current source transistor. The amplifier unit 120 may include the amplifier 122, and the feedback capacitor $C_F$ 124 connected to both ends of the amplifier 122. The amplifier 122 may be the cascode CMOS inverter. Some transistors from among the common-gate transistors, and the current source transistor may be disposed outside the substrate of the pixels 100.

With regard to the amplifying transistor, the compensation unit 200 may compensate for the threshold voltage shift by applying the first compensation voltage to the body electrode instead of connecting the body electrode to the ground. With regard to the common-gate transistor, the compensation unit 200 may compensate for the threshold voltage shift by respectively applying the second and third compensation voltage to the gate electrodes. With regard to the current source transistor, the compensation unit 200 may compensate for the threshold voltage shift by applying the fourth compensation voltage to the gate electrode. The compensation unit 200 may apply the different compensation voltage to each of the transistors forming the amplifier 122. Hereinafter, the detailed embodiment regarding application of the compensation voltage will be described with reference to FIG. 8.

Figure 8:
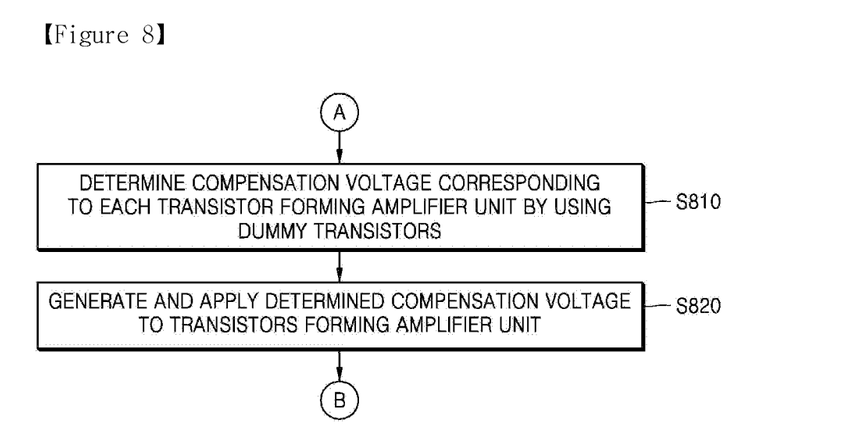
FIG. 8 is a detailed flowchart illustrating operations for applying compensation voltage in the method for driving the image sensor according to an embodiment of the present disclosure.

FIG. 8 is a detailed flowchart illustrating operations for applying the compensation voltage in the method for driving the image sensor 1000 according to an embodiment of the present disclosure.

In operation S810, the compensation unit 200 determines the compensation voltage that corresponds to each of the transistors forming the amplifier unit 120 by using the dummy transistors. The dummy transistors are transistors used for measuring the threshold voltage shift of the transistors forming the amplifier unit 120. The compensation unit 200 may include the separate dummy transistors corresponding to each of the transistors forming the amplifier unit 120 of the pixels 100, and may use the separate dummy transistors for measuring the actual threshold voltage shift of the transistors forming the amplifier unit 120.

In operation S820, the compensation unit 200 may generate and apply the determined compensation voltage to the transistors forming the amplifier unit 120.

Referring back to FIG. 7, in operation S720, the photoelectric transformation unit 110 generates, in the respective pixels 100, the charges according to the photoelectric transformation. The photoelectric transformation unit 110 may be formed of the at least one photoelectric transformation device. The at least one photoelectric transformation device may be the photodiode.

In the respective pixels 100, the amplifier unit 120 may amplify the current according to the charges generated according to the photoelectric transformation in operation S730. The amplified current is output to the outside through the lines connected to the respective pixels 100. The amplifier unit 120 may be connected to the amplifier 122 having the input terminal in which the current according to the charges generated in the photoelectric transformation unit 110 is input, and the output terminal that amplifies and outputs the input current, and to the input and output terminals of the amplifier 122, and may include the feedback capacitor $C_F$ 124 of charging or discharging the current generated in the photoelectric transformation unit 110.

As described above, according to the one or more of the above embodiments of the present disclosure, the MOS circuit of configuring the amplifier and the photodiode on the Si substrate may be manufactured without performance degradation so that manufacturing costs may be decreased and resolution of the image sensor may be improved.

It should be understood that the exemplary embodiments described therein should be considered in a descriptive sense only and not for purposes of limitation. Descriptions of features or aspects within each embodiment should typically be considered as available for other similar features or aspects in other embodiments. While one or more embodiments of the disclosure have been described with reference to the figures, it will be understood by those of ordinary skill in the art that various changes in form and details may be made therein without departing from the spirit and scope of the disclosure as defined by the following claims.

The invention claimed is:

1. An image sensor comprising a pixel array, the image sensor comprising:
   a photoelectric transformation unit for generating charges according to photoelectric transformation in each of pixels;
   an amplifier unit for amplifying current according to the generated charges in each pixel; and
   a compensation unit for applying compensation voltage compensating for threshold voltage shift to at least one of a plurality of transistors forming the amplifier unit.

2. The image sensor of claim 1, wherein the compensation unit applies a first compensation voltage to a body electrode of an amplifying transistor from among the plurality of transistors forming the amplifier unit.

3. The image sensor of claim 1, wherein the compensation unit applies a second compensation voltage to a gate electrode of a common-gate transistor from among the plurality of transistors forming the amplifier unit.

4. The image sensor of claim 1, wherein the compensation unit applies a third compensation voltage to a gate electrode of a current source transistor from among the plurality of transistors forming the amplifier unit.

5. The image sensor of claim 1, wherein the compensation unit applies different compensation voltage to each of the plurality of transistors forming the amplifier unit.

6. The image sensor of claim 1, wherein the compensation unit comprises:
   a dummy unit comprising a plurality of dummy transistors corresponding to the plurality of transistors forming the amplifier unit;
   a control unit for determining the compensation voltage of each of the plurality of transistors forming the amplifier unit by using the plurality of dummy transistors; and
   a power unit for applying the plurality of transistors forming the amplifier unit by generating the compensation voltage determined in the control unit.

7. The image sensor of claim 1, wherein some of the plurality of transistors forming the amplifier unit are disposed outside a substrate of the pixels.

8. The image sensor of claim 1, wherein the amplifier unit comprises:
   an amplifier formed of the plurality of transistors, and comprising an input terminal in which current according to the charges generated in the photoelectric transformation unit is input, and an output terminal that amplifies and outputs the input current; and
   a feedback capacitor connected to the input and output terminals of the amplifier, and charging or discharging the current according to the charges generated in the photoelectric transformation unit.

9. The image sensor of claim 8, wherein the amplifier comprises a cascode complementary metal-oxide-semiconductor (CMOS) inverter.

10. The image sensor of claim 1, wherein the threshold voltage shift results from a heat treatment process when the photoelectric transformation unit is formed in the respective pixels.

11. A method of driving an image sensor, wherein the image sensor comprises a pixel array where a photoelectric transformation unit for generating charges according to photoelectric transformation, and an amplifier unit for amplifying current according to the generated charges are prepared in each pixel, the method comprising:
   applying compensation voltage for compensating for threshold voltage shift to at least one of a plurality of transistors forming the amplifier unit included in each pixel;
   generating the charges according to the photoelectric transformation in the respective pixels; and
   amplifying the current according to the generated charges in the respective pixels.

12. The method of claim 11, wherein the applying of the compensation voltage comprises applying a first compensation voltage to a body electrode of an amplifying transistor from among the plurality of transistors forming the amplifier unit.

13. The method of claim 11, wherein the applying of the compensation voltage comprises applying a second compensation voltage to a gate electrode of a common-gate transistor from among the plurality of transistors forming the amplifier unit.

14. The method of claim 11, wherein the applying of the compensation voltage comprises applying a third compensation voltage to a gate electrode of a current source transistor from among the plurality of transistors forming the amplifier unit.

15. The method of claim 11, wherein the applying of the compensation voltage comprises applying different compensation voltage to each of the plurality of transistors forming the amplifier unit.

16. The method of claim 11, wherein the applying of the compensation voltage comprises:
  determining the compensation voltage corresponding to each of the plurality of transistors forming the amplifier unit by using a plurality of dummy transistors; and
  generating and applying the determined compensation voltage to the plurality of transistors forming the amplifier unit.

17. The method of claim 11, wherein some of the plurality of transistors forming the amplifier unit are disposed outside a substrate of the pixels.

18. The method of claim 11, wherein the amplifier unit comprises:
  an amplifier formed of the plurality of transistors, and comprising an input terminal in which the current according to the charges generated in the photoelectric transformation unit is input, and an output terminal that amplifies and outputs the input current; and
  a feedback capacitor connected to the input and output terminals of the amplifier, and charging or discharging the current according to the charges generated in the photoelectric transformation unit.

19. The method of claim 18, wherein the amplifier comprises a cascode CMOS inverter.

20. The method of claim 11, wherein the threshold voltage shift results from a heat treatment process when the photoelectric transformation unit is formed in the respective pixels.

* * * * *